US005666426A

United States Patent [19]
Helms

[11] Patent Number: 5,666,426
[45] Date of Patent: Sep. 9, 1997

[54] AUTOMATIC VOLUME CONTROL TO COMPENSATE FOR AMBIENT NOISE VARIATIONS

[75] Inventor: Frank P. Helms, Round Rock, Tex.

[73] Assignee: Advanced Micro Devices, Inc., Sunnyvale, Calif.

[21] Appl. No.: 733,656

[22] Filed: Oct. 17, 1996

[51] Int. Cl.$^6$ ..................................................... H03G 3/20
[52] U.S. Cl. ............................. 381/57; 381/104; 381/107
[58] Field of Search .............................. 381/56, 57, 104, 381/107, 108, 109

[56] References Cited

U.S. PATENT DOCUMENTS

| 5,081,682 | 1/1992 | Kato | 381/57 |
| 5,434,922 | 7/1995 | Miller | 381/57 |
| 5,450,494 | 9/1995 | Okubo | 381/57 |

FOREIGN PATENT DOCUMENTS

| 6148210 | 3/1986 | Japan | 381/57 |

*Primary Examiner*—Curtis Kuntz
*Assistant Examiner*—Minsun Oh
*Attorney, Agent, or Firm*—Haynes and Boone, L.L.P.

[57] ABSTRACT

A system and method for automatically adjusting the volume of an audio system to compensate for variations in ambient noise. The system includes a microphone for monitoring the ambient audio environment which includes output of the audio system plus environmental noise. The system also includes processing circuitry connected to the microphone. The processing circuitry varies the volume of the output of the audio system in proportion to changes in the environmental noise. The processing circuitry comprises the microphone, located to detect the ambient sound in the listening environment, an analog-to-digital converter connected to the output of the microphone, and a digital signal processor connected to the output of the analog-to-digital converter. The output signal of the DSP is an input to the volume control of the audio system.

4 Claims, 2 Drawing Sheets

AUTOMATIC VOLUME CONTROL TO COMPENSATE FOR AMBIENT NOISE VARIATIONS

TECHNICAL FIELD

The invention relates generally to audio systems and, more particularly, to a system and method for automatically adjusting the volume of an audio system to compensate for variations in ambient noise.

BACKGROUND OF THE INVENTION

Audio systems are very sophisticated devices used in many applications. Clarity and lucidity of modern audio systems have advanced tremendously. Despite the advances, however, the present systems do not adequately compensate or account for ambient conditions of the surroundings in which the systems are used.

An example of an audio system is a car stereo. The car stereo is located inside a car and, therefore, must interact with a wide variety of ambient noises. In a typical scenario, when the car is initially started, the ambient noise level due to road noise, wind noise, and engine noise is relatively low. Therefore, the car stereo may be set at an initial, low volume level. As the car begins to move, however, the ambient noise level increases, so the volume level of the car stereo must also increase to compensate for the increased noise. When the car reaches a high speed, the ambient noise becomes very loud so that the volume level of the car stereo must be increased even more. If the car slows, the ambient noise decreases and stereo volume level must be manually reduced. As a result, the volume level of the car stereo must be adjusted a number of times during a drive, so that the stereo can be heard comfortably over the varying ambient noise.

This constant requirement of adjusting the car stereo volume is undesirable for several reasons. Most importantly, for a driver to adjust the car stereo volume, he must remove his concentration from the road, thereby putting himself and others at risk. Furthermore, the constant adjustment of the car stereo volume can be a nuisance to the listener and detracts from the enjoyment of listening to the car stereo.

Therefore, what is needed is a system and method for automatically adjusting the volume of an audio system to compensate for variations in ambient noise.

SUMMARY OF THE INVENTION

An embodiment of the invention is a device for automatically controlling an audio volume of an audio system. The audio system includes an audio signal source, an audio amplifier, and a sound output mechanism. The audio system outputs the audio volume to an environment of an ambient noise. The device comprises a microphone for receiving the ambient noise and the audio volume cumulatively, and a processing circuit connected to the microphone, capable of automatically adjusting the audio volume in response to the ambient noise and the audio volume received.

Another embodiment of the invention is a device for automatically controlling a first volume level of an audio system. The audio system includes an audio signal source, an audio amplifier, and a sound output mechanism. The audio system outputs a system sound of the first volume level into an environment of an environmental sound of a second volume level that includes the system sound and a varying external sound. The device comprises a microphone for receiving the system sound and the varying external sound and processing circuitry connected to the microphone for varying the first volume level of the system sound in relation to variation in the second volume level of the environmental sound.

Yet another embodiment of the invention is a method for amplifying a data signal from a data source located in an environment. The method comprises receiving an ambient noise signal from the environment, receiving an amplified signal, determining a ratio of the amplified signal to the ambient noise signal, comparing the ratio to a benchmark, and amplifying the amplified signal in proportion to the difference between the ratio and the benchmark.

DESCRIPTION OF THE PREFERRED EMBODIMENTS

Figure 1:
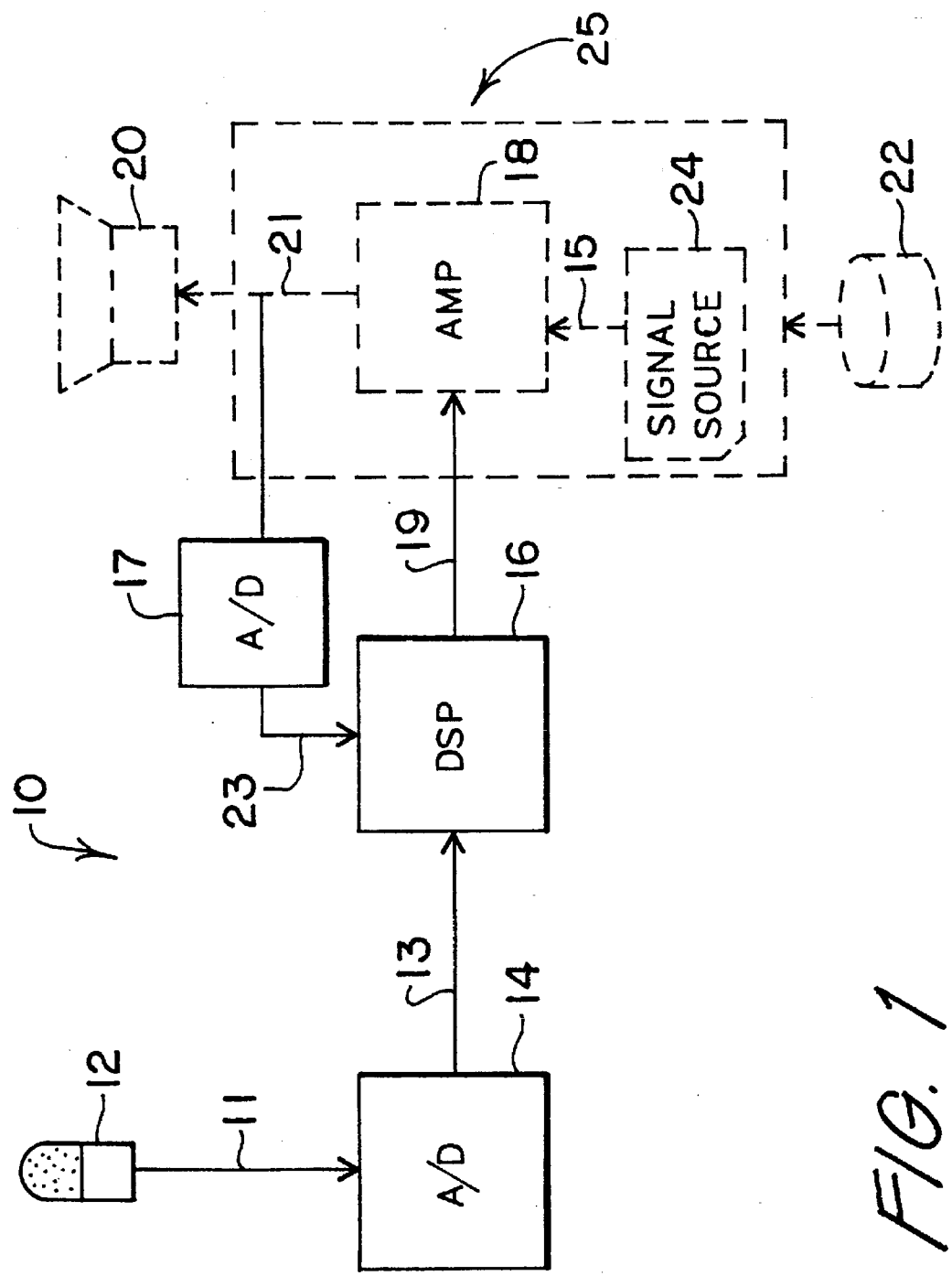
FIG. 1 is a block diagram of an automatic volume control system according to embodiments of the present invention, showing a conventional audio system in phantom.

Referring to FIG. 1, the reference numeral 10 refers, in general, to an automatic volume control system according to embodiments of the present invention. The automatic volume control system 10 comprises a microphone 12, an analog-to-digital (A/D) converter 14, an analog-to-digital (A/D) converter 17, and a digital signal processor ("DSP") 16. The automatic volume control system 10 connects to and controls a conventional audio system 25 (shown in phantom).

The microphone 12 electrically communicates to the A/D converter 14 an analog ambient sound signal 11. The A/D converter 14 electrically communicates to the DSP 16 a digital ambient sound signal 13 which is a digital representation of the information represented by the analog ambient sound signal 11. The DSP 16 electrically communicates to the conventional audio system 25 a gain level signal 19 which varies the audio volume level of the conventional audio system 25 to compensate for variations in ambient noise in the environment in which the conventional audio system 25 is played.

The conventional audio system 25 includes an audio amplifier (Amp) 18, a speaker 20, a manual volume control 22, and a sound source 24. The sound source 24 maybe any of a variety of sound output devices, such as, for example, a radio tuner, a television tuner, an audio tape player, or some other device. The manual volume control 22 is connected to the conventional audio system 25 and controls the volume level of the amplified sound that is output by the conventional audio system 25, in a conventional manner. The signal source 24 electrically communicates to the Amp 18 a signal output 15 of the signal source 24. The Amp 18 electrically communicates to the speaker 20 an amplified output 21 of the Amp 18. The Amp 18 electrically communicates to the A/D converter 17 of the automatic volume control system 10 the amplified output 21. A digital amplified output 23 of the A/D converter 17 is electrically communicated to the DSP 16.

In operation, the microphone 12 receives the total ambient sound, including the amplified sound that is output by the speaker 20 of the automatic volume control system 10 and environmental noise, from an environment in which the amplified sound is projected through the speaker 20. In the example of a car stereo employing the automatic volume control system 10, the microphone 12 is positioned to receive the total ambient sound, including stereo sound and environmental noise, from an interior of a car in which the conventional audio system 25 is playing. The microphone 12 receives the total ambient sound, including stereo sound and environmental noise, from the environment and converts the total ambient sound to the analog ambient sound signal 11. The microphone 12 delivers the analog ambient sound signal 11 to the A/D converter 14. The A/D converter 14 converts the analog ambient sound signal 11 to a digital ambient sound signal 13 and delivers the digital ambient sound signal 13 to the DSP 16.

The DSP 16 also receives the digital amplified output signal 23, which is the digital representation of the amplified output signal 21 from the conventional audio system 25. As such, the digital amplified output signal 23 is, of course, indicative of the gain level of the Amp 18. The DSP 16 processes the digital ambient sound signal 13 and the digital amplified output signal 23 to determine a signal-to-noise ratio according to the following formula: Signal-to-Noise Ratio =(amplified output signal 21)/[(digital ambient noise signal 13) - (amplified output signal 21)]. Based on the signal-to-noise ratio, the DSP 16 selectively determines and outputs the gain level signal 19. In operation, the DSP 16 initially determines a ratio of the digital amplified output signal 23 to the environmental noise (i.e., the environmental noise is calculated by the DSP 16 as the digital ambient sound signal 13 minus the digital amplified output signal 23, as just previously described) at a point in time soon after power-up of the automatic audio control system 10 and initial adjustment of volume level, via the manual volume control 22 by the listener, of the amplified sound that is output by the conventional audio system 25 to the environment. The DSP 16 thereafter again at subsequent times determines the signal-to-noise ratio according to the formula and, based on a comparison of the then-determined signal-to-noise ratio to the initially-determined signal-to-noise ratio, varies the gain level signal 19 to the Amp 18. The gain level signal 19 to the Amp 18 causes the Amp 18 to adjust amplification, either by increasing, decreasing, or maintaining the then-current amplification level, depending on the particular magnitude of the gain level signal 19. The variation of the gain level signal 19 by the DSP 16 serves to, over time, maintain the determined signal-to-noise ratio relatively constant.

Figure 2:
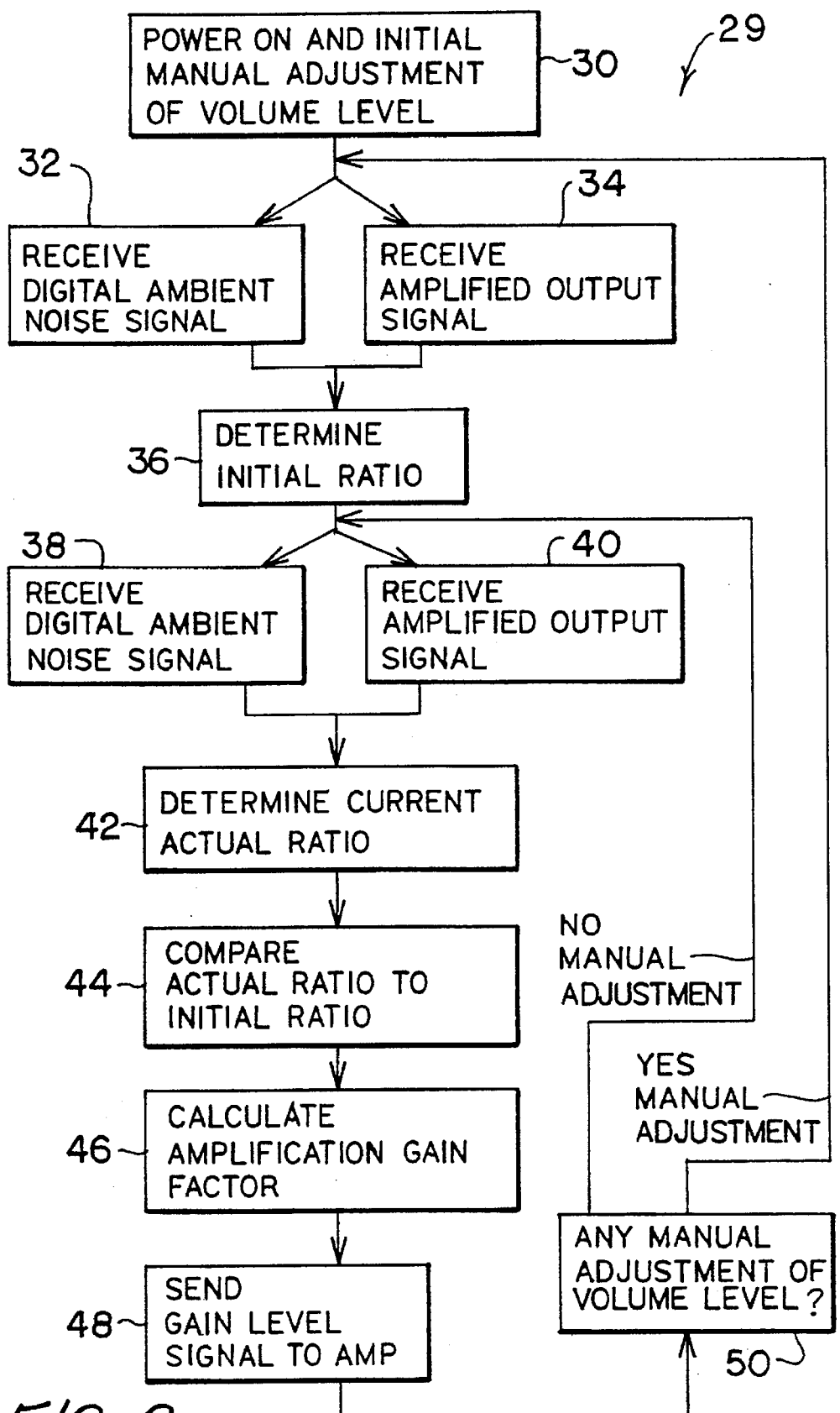
FIG. 2 is a flow chart of a routine of a digital signal processor of the automatic volume control system of FIG. 1.

Referring to FIG. 2, a method 29 of operation of the DSP 16 of the automatic volume control system 10 comprises several steps. In a first step 30, the automatic volume control system 10 is powered on, for example, at the same time that the conventional audio system 25 is powered on. Once powered on, the volume level of the sound output by the conventional audio system 25 is typically varied by the listener, such as via the manual volume control 22. Alternatively, the listener may be satisfied that the volume level on power up is satisfactory and the volume level is not varied by the listener. In such an instance, an initial time period passes during which the volume level is not varied via the manual volume control 22. In any case, an initial ambient sound level is sensed by the microphone 12 of the automatic volume control system 10. The initial ambient sound level sensed by the microphone is the sound from the conventional audio system 25 plus environmental noise actually sensed by the microphone 12. When the ambient sound level is sensed by the microphone 12, the microphone 12 passes to the A/D converter 14 the analog ambient sound signal 11 corresponding to the ambient sound level. At the A/D converter 14, the analog ambient sound signal 11 is converted to a digital ambient noise signal 13.

A second step 32 and a third step 34 are simultaneously performed. In the second step 32 and the third step 34, the DSP 16, respectively, receives the digital ambient noise signal 13 from the A/D converter 14 and receives the digital amplified output signal 23 which is output by the A/D converter 17 on digital conversion of the amplified output signal 21 which is output by the Amp 18.

In a fourth step 36, the DSP 16 processes the digital ambient sound signal 13 and the digital amplified output signal 23. In the processing, the DSP 16 determines and saves an initial ratio value that corresponds to the ratio of the digital amplified output signal 23 to the digital ambient noise signal 13 minus the digital amplified output signal 23 (i.e., the initially determined signal-to-noise ratio, previously described).

A fifth step 38 and sixth step 40 are simultaneously performed. In the fifth step 38, the DSP 16 again receives the digital ambient sound signal 13. The DSP 16 simultaneously receives the digital amplified output signal 23 in the sixth step 40.

In a seventh step 42, the DSP 16 again processes the digital ambient sound signal 13 and the digital amplified output signal 23. In the processing, the DSP 16 determines an actual ratio value that corresponds to the ratio of the digital amplified output signal 23 to the digital ambient sound signal 13 minus the digital amplified output signal 23, each then-received.

The DSP 16, in an eighth step 44, compares the actual ratio value to the initial ratio value.

In a ninth step 46, the DSP 16 calculates an amplification gain factor indicative of the results of the comparison of the eighth step 44.

In a tenth step 48, the DSP 16 outputs to the Amp 18 the gain level signal 19. If the actual ratio value differs from the initial ratio value, the DSP 16 outputs the gain level signal 19 that corresponds to the difference. For example, the gain level signal 19 is unchanged if the actual ratio value is the same as the initial ratio value. If the actual ratio value is higher than the initial ratio value, however, the gain level signal 19 is reduced. If, on the other hand, the actual ratio value is lower than the initial ratio value, the gain level signal 19 is increased.

In an eleventh step 50, the conventional audio system 25 indicates to the DSP 16 whether or not any adjustment to volume level of the conventional audio system 25 is made, for example, by the listener via the manual volume control 22. If an adjustment is so made, the method 29 returns to steps two 32 and three 34 to again determine the initial ratio value in step four 36 based on the digital amplified output signal 23 and the digital ambient noise signal 13 then received by the DSP 16. If an adjustment to the volume is not made, the method 20 returns to steps five 38 and six 40 to again determine the actual ratio value based on the digital amplified output signal 23 and the digital ambient noise signal 13 then-currently received by the DSP 16 and the initial ratio value originally determined on power up in step 30.

As those skilled in the art will know and appreciate, several variables may be varied in the method 29. For instance, the timing and details of determination of the initial ratio value may be varied. A suitable arrangement for the determinations are that the initial ratio value is determined within half a minute after power-on of the conventional audio system 25. Such a time period allows the conventional audio system 25 to reach its full operational potential and gives the listener time to perform the manual adjustment of the volume level of the sound output. Also, the cycle time at which the actual ratio value is determined may vary according to desired results. For example, it may be preferable that the volume adjustment by the DSP 16 operation be relatively infrequent, such as every five seconds. Of course, the frequency of volume adjustment is optimally varied with a frequency that is suitable to the listener. Further, various possibilities are presented for the operation of the DSP 16 to output the gain level signal 19 in response to the results of the comparison in the eighth step 44. For example, the DSP 16, in one arrangement, responds to the comparison by outputting as the gain level signal 19 a signal corresponding to the then-determined actual ratio value. Whereas, alternatively, the gain level signal 19 could be varied only if the difference between the initial ratio value and the actual ratio value exceeds a certain value, if a given period of time has passed since a prior variation in the gain level signal 19, if the difference between the initial ratio value and the actual ratio value is maintained for a given period, and if other conditions are present, as desired.

In every event, however, a result of the automatic volume control system 10 and the method 29 is that the volume level output by the speaker 20 of the conventional audio system 25 will automatically adjust so that the audio output will always be comfortably heard by the listener at what seems to be a relatively consistent intensity above any noise from the environment.

Although illustrative embodiments of the present invention have been shown and described, a latitude of modification, change and substitution is intended in the foregoing disclosure, and in certain instances, some features of the invention will be employed without a corresponding use of other features. For example, the present invention can be combined for use with a television audio/video system. Furthermore, the DSP 16 can be replaced with discrete processing circuits. Even more, comparisons made to determine adjustment to be made to volume level may be made of other variables or ratios, for example, noise-to-signal ratios could alternatively be determined and compared with opposite adjustments to volume being made based on the results of the comparison, as those skilled in the art will know and appreciate. Finally, additional circuits and features may be added to the illustrative embodiments without altering the scope of the invention. Accordingly, it is appropriate that the appended claims be construed broadly and in a manner consistent with the scope of the invention.

What is claimed is:

1. A device for automatically controlling a first volume level of an audio system, the audio system including an audio signal source, an audio amplifier, and a sound output mechanism, the audio system outputs a system sound of the first volume level into an environment of an environmental sound of a second volume level that includes the system sound and a varying external sound, comprising:

a microphone for receiving the system sound and the varying external sound;

processing circuitry connected to the microphone for varying the first volume level of the system sound in relation to variation in the second volume level of the environmental sound;

a microphone located to detect the second volume level of the environmental sound;

a first analog-to-digital converter connected to the microphone;

a digital signal processor connected to the first analog-to-digital converter;

wherein the digital signal processor controls the first volume level;

a gain level output of the digital signal processor delivered to the audio system;

a second analog-to-digital converter connected to the audio system;

an output of the second analog-to-digital converter provided to the digital signal processor;

wherein the microphone detects the environmental sound and the system sound and provides to the first analog-to-digital converter a cumulative volume level of the first volume level plus the second volume level;

wherein the first analog-to-digital converter provides to the digital signal processor the cumulative volume level;

wherein the digital signal processor divides the first volume level by the sum equal to the cumulative volume level minus the first volume level and evaluates the quotient of the division; and wherein the gain level output varies the first volume level in proportion to the difference between the quotient of the division and a benchmark.

2. The device of claim 1, wherein the benchmark is determined by the digital signal processor as the quotient of the division of the first volume level by the second volume level on power-up of the audio system.

3. A method for amplifying an audio signal in a noisy environment, the method comprising:

a) providing a device for automatically controlling the output signal level of an audio system;

b) providing a microphone for receiving an analog audio input signal comprising the combination of the output signal of the audio system and a varying ambient environmental signal;

c) providing processing circuitry connected to the microphone for varying the output signal level of the audio system in relation to variation in the level of the varying ambient environmental sound signal;

d) providing an analog-to-digital converter connected to the microphone;

e) providing a digital signal processor connected to the output of the analog-to-digital converter;

wherein the digital signal processor controls the audio system output signal level;

f) converting the analog audio input signal to a digital audio signal;

g) providing the digital signal processor with the converted signal;

h) dividing the audio system output signal by the sum of the analog audio input signal minus the varying ambient environmental signal to obtain an audio system output to environment signal ratio; and i) amplifying the audio system output signal in proportion to the difference between the environment signal ratio and a benchmark.

4. The method of claim 3, wherein the method is continually repeated.

* * * * *